United States Patent [19]

Murakami

[11] Patent Number: 5,774,015
[45] Date of Patent: Jun. 30, 1998

[54] COMPACT SEMICONDUCTOR INTEGRATED CIRCUIT CAPABLE OF REDUCING ELECTROMAGNETIC EMISSION

[75] Inventor: Kouichi Murakami, Tokyo, Japan

[73] Assignee: NEC Corporation, Tokyo, Japan

[21] Appl. No.: 572,019

[22] Filed: Dec. 14, 1995

[30] Foreign Application Priority Data

Dec. 15, 1994 [JP] Japan .................................. 6-332919

[51] Int. Cl.⁶ ............................................. H01L 27/04
[52] U.S. Cl. ........................................... 327/565; 327/565
[58] Field of Search .................................. 327/564, 566, 327/534, 535, 538, 541, 543

[56] References Cited

U.S. PATENT DOCUMENTS

| | | | |
|---|---|---|---|
| 4,599,522 | 7/1986 | Matsuo et al. | 327/382 |
| 4,988,902 | 1/1991 | Dingwall | 327/382 |
| 5,294,826 | 3/1994 | Marcantonio et al. | 257/659 |
| 5,317,207 | 5/1994 | Mortensen | 307/443 |

FOREIGN PATENT DOCUMENTS 64-15820   1/1989   Japan .
3-129416   6/1991   Japan .

OTHER PUBLICATIONS

"Radiation From Packaged Integrated Circuits", Koga, Ryuji, pp. 581–584.
"Prediction of Near–Field Electromagnetic Emission from a Digital Circuit Board Based on Resonance Characteristics," Wada, Osami, et al., pp. 304–307.

Primary Examiner—Timothy P. Callahan
Assistant Examiner—T. T. Lam
Attorney, Agent, or Firm—Sughrue, Mion, Zinn Macpeak & Seas, PLLC

[57] ABSTRACT

In a semiconductor integrated circuit for use in a signal processing, each of semiconductor elements contained in a region 101 is composed of a MOS transistor having a short channel length while each of semiconductor elements contained in a region 102 is composed of a MOS transistor having a long channel length. Although the semiconductor elements contained in the region 101 are rapidly operable with a short rising time and a short trailing time, those contained in the region 102 are operable comparatively slow with a long rising time and a long trailing time. Accordingly, it is possible to reduce electromagnetic emissions produced in the region 102.

9 Claims, 5 Drawing Sheets

COMPACT SEMICONDUCTOR INTEGRATED CIRCUIT CAPABLE OF REDUCING ELECTROMAGNETIC EMISSION

BACKGROUND OF THE INVENTION

This invention relates to a semiconductor integrated circuit, such as a Large Scale Integration circuit.

Recently, an operation of the semiconductor integrated circuit has been accelerated. When a transistor in the semiconductor integrated circuit is subjected to fast on-off operations, higher harmonics components at a rising edge and a trailing edge cause an electromagnetic emission. The electromagnetic emission brings about an electromagnetic interference on surrounding circuits or equipments. As a result, deterioration of performance or malfunction of those circuits and equipments is caused to occur due to the electromagnetic interference.

A conventional semiconductor integrated circuit is for use in a signal processing circuit in which a serial data signal is to be processed after a serial-parallel conversion. In the serial-parallel conversion circuit, a serial data signal supplied from a data input terminal IN with a frequency f is parallelly converted into n columns by an output of a clock signal dividing circuit. Data 1 to n of n columns and of f/n frequency is then produced from the serial-parallel conversion circuit. In a digital signal processing circuit, each of the predetermined operations is carried out against the data 1 to n of n columns. Then, in a parallel-serial conversion circuit, the data 1 to n of n columns is subjected to a serial conversion and produced from a data output terminal as a data having a frequency f again.

In such a circuit, in order to accelerate the signal processing, semiconductor elements for constructing each circuit, for example, all of MOS transistors are designed so that each gate is driven at the maximum operational frequency. Consequently, the rising time and the trailing time of the MOS transistor in each circuit becomes extremely short. During the rising time and the trailing time, the above-mentioned higher harmonics components are produced to cause the electromagnetic emission.

Conventional semiconductor integrated circuits capable of reducing such the electromagnetic emission are disclosed, for example, in Japanese Unexamined Patent Publications Nos. S64-15820 and H3-129416. In the semiconductor integrated circuit disclosed in S64-15820, a clock signal having a frequency lower than that required within the semiconductor integrated circuit is supplied thereto, and a clock signal having the required frequency is produced within the semiconductor integrated circuit. Consequently, the electromagnetic emission caused by the high frequency clock signals is reduced at an input portion of the semiconductor integrated circuit. On the other hand, in the semiconductor integrated circuit disclosed in H3-129416, a sinusoidal wave is supplied to an input portion of the semiconductor integrated circuit, and the sinusoidal wave is converted into a rectangular wave within the semiconductor integrated circuit. Since the rectangular wave is not supplied to the input portion, the electromagnetic emission at the input portion is reduced.

However, an important problem still remains in the semiconductor integrated circuits disclosed in the above-referenced papers. Namely, it is possible to effectively prevent the remarkable electromagnetic emission at the input portion while it is difficult to reduce the electromagnetic emission produced at the inner circuit. The reason is that fast operations are still carried out in the semiconductor element of the inner circuit. In addition, a frequency changing circuit and a waveform shaping circuit are required for the semiconductor integrated circuit disclosed in the above-referenced papers. As a result, the semiconductor integrated circuit inevitably becomes bulky in structure. Accordingly, it becomes difficult to provide a compact semiconductor integrated circuit of high density.

SUMMARY OF THE INVENTION

It is therefore an object of this invention to provide a compact semiconductor integrated circuit of high density in which electromagnetic emission can be reduced effectively.

Other objects of this invention will become clear as the description proceeds.

According to an aspect of this invention, there is provided a semiconductor integrated circuit comprising: a fast operation circuit which is operable at a primary operation speed and which is composed of a semiconductor element having a first rising time and a first trailing time; a slow operation circuit which is operable at a secondary operation speed smaller than the primary operation speed and which is composed of a semiconductor element having a second rising time and a second trailing time; and the second rising time and the second trailing time being longer than the first rising time and the first trailing time.

The fast operation circuit may be composed of a first MOS transistor having a first channel length, the slow operation circuit may be composed of a second MOS transistor having a second channel length, wherein the second channel length is larger than the first channel length.

The fast operation circuit may be supplied with a first bias voltage, the slow operation circuit may be supplied with a second bias voltage, wherein the second bias voltage is lower than the first bias voltage.

The fast operation circuit may be composed of a first semiconductor element having a first parasitic capacitance, the slow operation circuit may be composed of a second semiconductor element having a second parasitic capacitance, wherein the second parasitic capacitance is larger than the first parasitic capacitance.

DESCRIPTION OF THE PREFERRED EMBODIMENT

Figure 1:
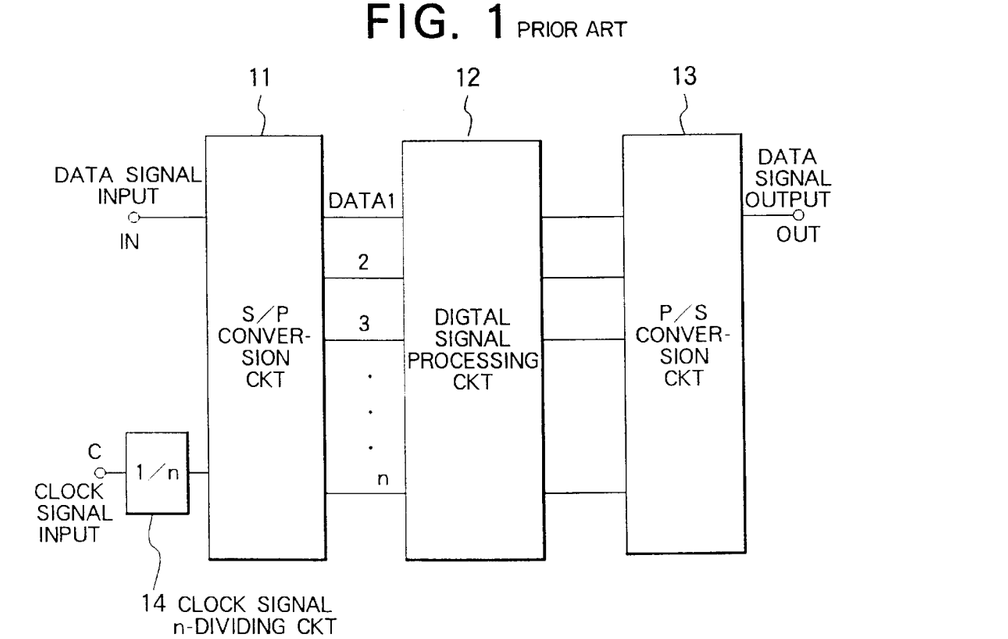
FIG. 1 is a block diagram of a signal processing circuit in which a conventional semiconductor integrated circuit is employed.
Figure 2:
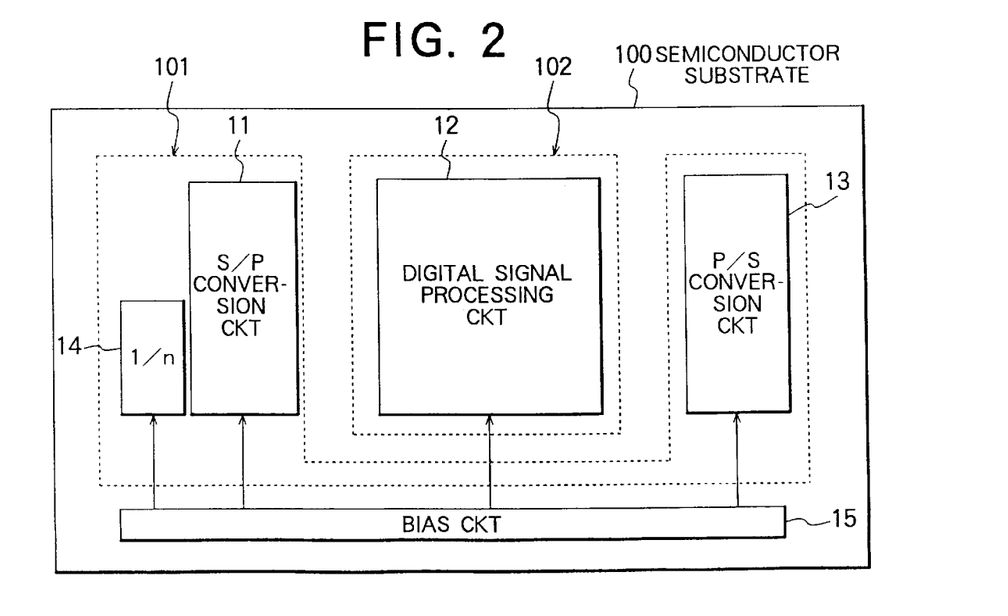
FIG. 2 is a block diagram of a semiconductor integrated circuit according to a first embodiment of the present invention.

Referring to FIGS. 1 and 2, description is at first made about a conventional semiconductor integrated circuit for a better understanding of the present invention.

FIG. 1 shows a block diagram of a signal processing circuit in which the conventional semiconductor integrated circuit is employed.

In the signal processing circuit illustrated in FIG. 1, a serial data signal is to be processed after a serial-parallel conversion. In the serial-parallel conversion circuit 11, a serial data signal supplied from a data input terminal IN with a frequency f is parallelly converted into n columns by an output of a clock signal dividing circuit 14. Data 1 to n of n columns and of f/n frequency is then produced from the serial-parallel conversion circuit 11. In a digital signal processing circuit 12, each of the predetermined operations is carried out against the data 1 to n of n columns. Then, in a parallel-serial conversion circuit 13, the data 1 to n of n columns is subjected to a serial conversion and produced from a data output terminal OUT as a data having a frequency f again.

In such the circuit, in order to accelerate the signal processing, semiconductor elements for constructing each circuit, for example, all of MOS transistors are designed so that each gate is driven at the maximum operational frequency. Consequently, the rising time and the trailing time of the MOS transistor in each circuit becomes extremely short. During the rising time and the trailing time, the above-mentioned higher harmonics components are produced to cause the electromagnetic emission.

Figures 3A, 3B:
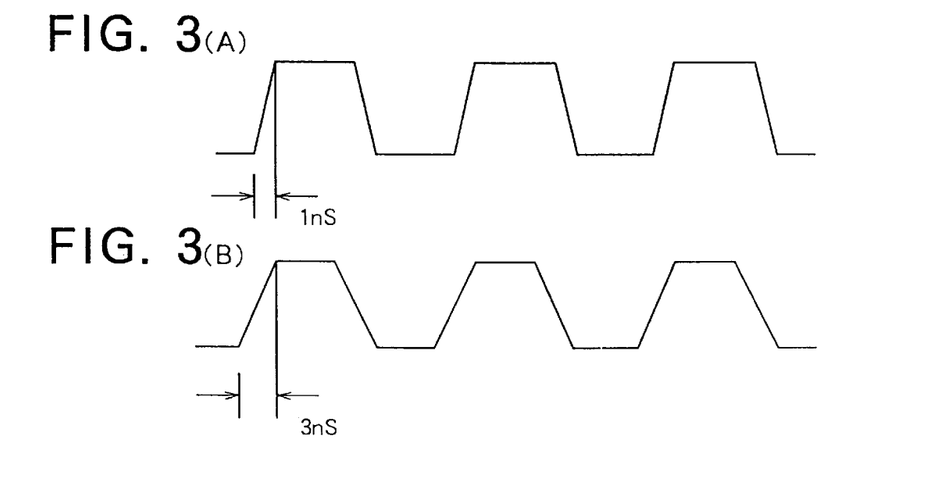
FIG. 3(A) is a view for illustrating a rising time and a trailing time of a waveform in a short channel length region of the semiconductor integrated circuit illustrated in FIG. 2.
FIG. 3(B) is a view for illustrating a rising time and a trailing time of a waveform in a long channel length region of the semiconductor integrated circuit illustrated in FIG. 2.

Referring to FIGS. 2, 3(A) and 3(B), description will proceed to a semiconductor integrated circuit according to a first embodiment of the present invention.

FIG. 2 shows a block diagram of the semiconductor integrated circuit illustrated in FIG. 1 mounted on a semiconductor substrate 100. In FIG. 2, a region 101 of elements each having a short channel length is defined by the serial-parallel conversion circuit 11, the parallel-serial conversion circuit 13, and the clock signal dividing circuit 14. Each of the elements contained in the region 101 is composed of MOS transistors each of which has a short channel length so as to be rapidly operable with a short rising time and a short trailing time in response to a frequency f. On the other hand, a region 102 of elements each having a long channel length is defined by the digital signal processing circuit 12. Each of the elements contained in the region 102 is composed of MOS transistors each of which has a long channel length, since it is operable comparatively slow with a long rising time and a long trailing time in response to a frequency f/n. Further, the semiconductor integrated circuit comprises a bias circuit 15 for supplying each of the serial-parallel conversion circuit 11, the digital signal processing circuit 12, the parallel-serial conversion circuit 13, and the clock signal dividing circuit 14 with a bias voltage.

Referring to FIGS. 3(A) and 3(B) with reference to FIG. 2 continued, description is made about an operation of the semiconductor integrated circuit illustrated in FIG. 2.

When the semiconductor integrated circuit is driven, respective operations are carried out in the region 101 and the region 102, as follows. Since each of the MOS transistors contained in the serial-parallel conversion circuit 11, the parallel-serial conversion circuit 13, and the clock signal dividing circuit 14 of the region 101 has a short channel length, operations therein are carried out rapidly with a short rising time and a short trailing time of about 1 nS, as shown in FIG. 3(A), in response to a frequency f. On the other hand, since each of the MOS transistors contained in the digital signal processing circuit 12 of the region 102 has a long channel length, an operation therein are carried out comparatively slow with a long rising time and a long trailing time of about 3 nS, as shown in FIG. 3(B), in response to the same frequency f. In this case, the digital signal processing circuit 12 becomes operable with a frequency f/n. Accordingly, the operation in the digital signal processing circuit 12 is not subjected to a harmful effect, even though the rising time and the trailing time become long, as mentioned above. As the digital signal processing circuit 12 occupies a major part of the semiconductor integrated circuit, the rising time and the trailing time of the MOS transistors contained in the major part become long. Since a quantity of electromagnetic emission caused by operations of MOS transistors is in inverse proportion to a length of the rising time and the trailing time, it becomes possible that a quantity of electromagnetic emission produced in the digital signal processing circuit 12 is reduced. It should be noted that quantities of electromagnetic emissions caused by operations of MOS transistors in the serial-parallel conversion circuit 11, the parallel-serial conversion circuit 13, and the clock signal dividing circuit 14 are not reduced. Nevertheless, it is possible that quantities of electromagnetic emissions are drastically reduced, as a whole, in the semiconductor integrated circuit. The reason is that the serial-parallel conversion circuit 11, the parallel-serial conversion circuit 13, and the clock signal dividing circuit 14 merely occupy a minor part of the semiconductor integrated circuit.

Figure 4:
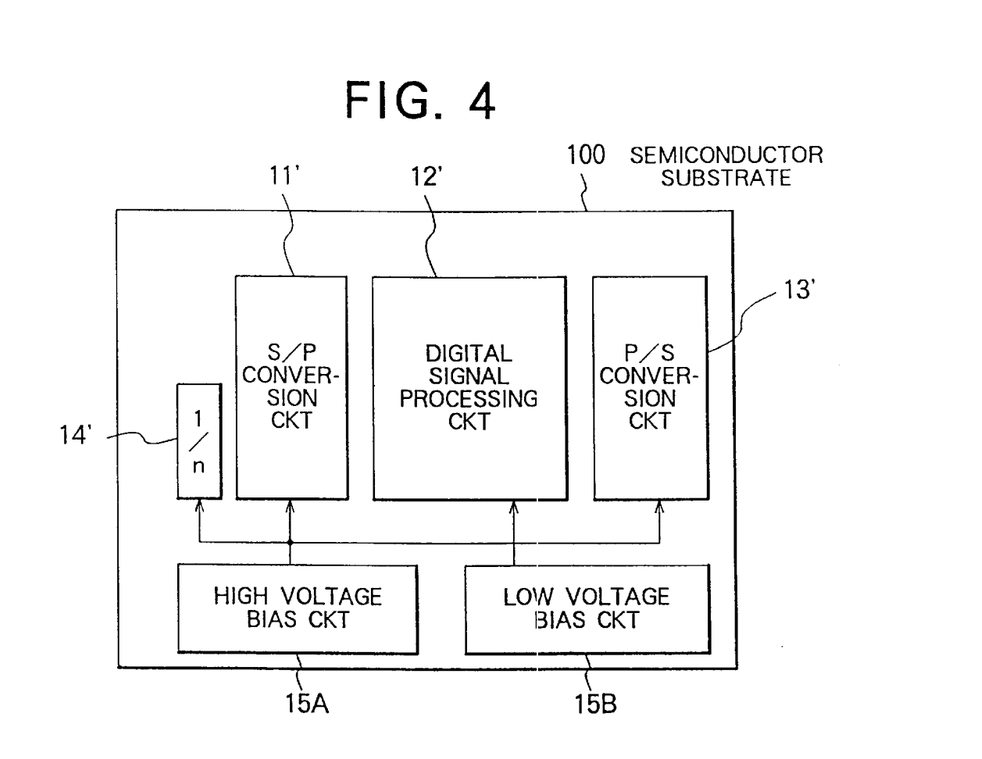
FIG. 4 is a block diagram of a semiconductor integrated circuit according to a second embodiment of the present invention.

Referring to FIG. 4, description will proceed to a semiconductor integrated circuit according to a second embodiment of the present invention.

FIG. 4 shows a block diagram of the semiconductor integrated circuit according to the second embodiment.

The semiconductor integrated circuit illustrated in FIG. 4 has a structure similar to that of the first embodiment illustrated in FIG. 2. Similar portions are designated by like reference numerals.

In FIG. 4, the semiconductor integrated circuit comprises a high voltage bias circuit 15A and a low voltage bias circuit 15B. The semiconductor integrated circuit further comprises the serial-parallel conversion circuit 11, the digital signal processing circuit 12, the parallel-serial conversion circuit 13, and the clock signal dividing circuit 14. Herein, MOS transistors contained not only in the serial-parallel conversion circuit 11, the parallel-serial conversion circuit 13, and the clock signal dividing circuit 14, but also in the digital signal processing circuit 12 have a channel length identical with each other. However, a gate and a drain of each MOS transistor contained in the serial-parallel conversion circuit 11, the parallel-serial conversion circuit 13, and the clock signal dividing circuit 14 are supplied by the high voltage bias circuit 15A with a high voltage as a bias voltage so that each of the MOS transistors is rapidly operable with a short rising time and a short trailing time in response to a frequency f. On the other hand, a gate and a drain of each MOS transistor contained in the digital signal processing circuit 12 are supplied by the low voltage bias circuit 15B with a low voltage as a bias voltage so that each of the MOS transistors is slowly operable with a long rising time and a long trailing time in response to the frequency f.

Turning to FIGS. 3(A) and 3(B) with reference to FIG. 4 continued, description is made about an operation of the semiconductor integrated circuit illustrated in FIG. 4.

When the semiconductor integrated circuit is driven, respective operations are carried out in a group of the serial-parallel conversion circuit 11, the parallel-serial conversion circuit 13, and the clock signal dividing circuit 14 and in the digital signal processing circuit 12, as follows. Since each of the MOS transistors contained in the serial-parallel conversion circuit 11, the parallel-serial conversion circuit 13, and the clock signal dividing circuit 14 is supplied by the high voltage bias circuit 15A with a high voltage as a bias voltage, operations therein are carried out rapidly with a short rising time and a short trailing time of about 1 nS, as shown in FIG. 3(A), in response to a signal having a frequency f or a clock signal. On the other hand, since each of the MOS transistors contained in the digital signal processing circuit 12 is supplied by the low voltage bias circuit 15B with a low voltage as a bias voltage, an operation therein is carried out comparatively slow with a long rising time and a long trailing time of about 3 nS, as shown in FIG. 3(B), in response to the same signal having a frequency f or a clock signal. As the digital signal processing circuit 12 occupies a major part of the semiconductor integrated circuit, the rising time and the trailing time of the MOS transistors contained in the major part become long. Since a quantity of electromagnetic emission caused by operations of MOS transistors is in inverse proportion to a length of the rising time and the trailing time, it becomes possible that a quantity of electromagnetic emission produced in the digital signal processing circuit 12 is reduced. It should be noted that quantities of electromagnetic emissions caused by operations of MOS transistors in the serial-parallel conversion circuit 11, the parallel-serial conversion circuit 13, and the clock signal dividing circuit 14 are not reduced. Nevertheless, it is possible that quantities of electromagnetic emissions are drastically reduced, as a whole, in the semiconductor integrated circuit. The reason is that the serial-parallel conversion circuit 11, the parallel-serial conversion circuit 13, and the clock signal dividing circuit 14 merely occupy a minor part of the semiconductor integrated circuit.

Referring to FIGS. 1, 5, 6(A) and 6(B), description will proceed to a semiconductor integrated circuit according to a third embodiment of the present invention.

Figure 5:
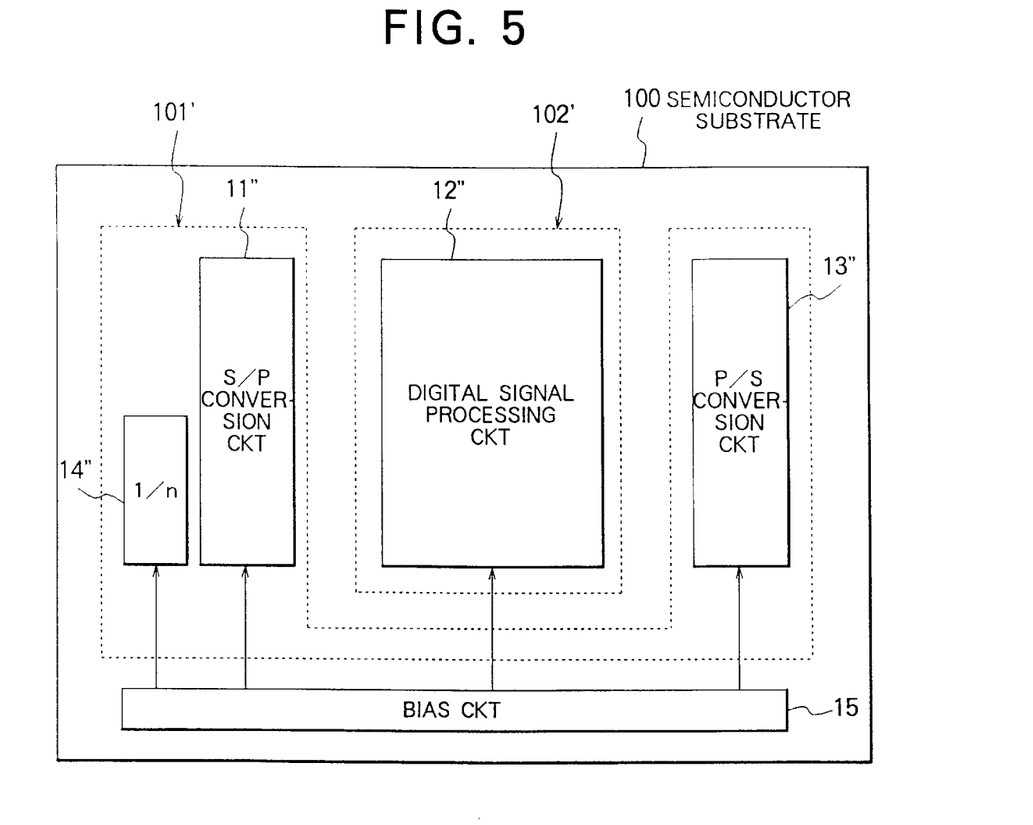
FIG. 5 is a block diagram of a semiconductor integrated circuit according to a third embodiment of the present invention.

FIG. 5 shows a block diagram of the semiconductor integrated circuit illustrated in FIG. 1 mounted on a semiconductor substrate 100. In FIG. 5, a region 101' of elements each having a small parasitic capacitance and a high cut-off frequency defined by the serial-parallel conversion circuit 11", the parallel-serial conversion circuit 13", and the clock signal dividing circuit 14". Each of the elements contained in the region 101' is composed of the MOS transistors each of which has a small parasitic capacitance and a high cut-off frequency so as to be rapidly operable with a short rising time and a short trailing time in response to a frequency f. On the other hand, a region 102' of elements each having a large parasitic capacitance and a low cut-off frequency is defined by the digital signal processing circuit 12". Each of the elements contained in the region 102' is composed of MOS transistors each of which has a large parasitic capacitance and a low cut-off frequency, since it is operable comparatively slow with a long rising time and a long trailing time in response to a frequency f/n. Further, the semiconductor integrated circuit comprises a bias circuit 15 for supplying each of the serial-parallel conversion circuit 11", the digital signal processing circuit 12", the parallel-serial conversion circuit 13", and the clock signal dividing circuit 14" with a bias voltage.

Figure 6A:
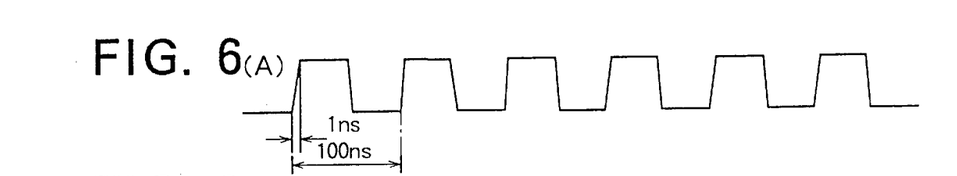
FIG. 6(A) is a view for illustrating a rising time and a trailing time of a waveform in a small capacitance region of the semiconductor integrated circuit illustrated in FIG. 5.
Figure 6B:
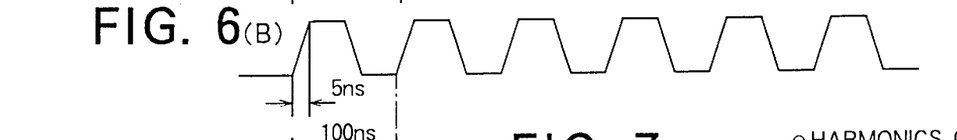
FIG. 6(B) is a view for illustrating a rising time and a trailing time of a waveform in a large capacitance region of the semiconductor integrated circuit illustrated in FIG. 5.

Referring to FIGS. 6(A) and 6(B) with reference to FIG. 5 continued, description is made about an operation of the semiconductor integrated circuit illustrated in FIG. 5.

When the semiconductor integrated circuit is driven, respective operations are carried out in the region 101' and the region 102', as follows. Since each of the MOS transistors contained in the serial-parallel conversion circuit 11", the parallel-serial conversion circuit 13", and the clock signal dividing circuit 14" of the region 101' has a small parasitic capacitance, operations therein are carried out rapidly with a short rising time and a short trailing time of about 1 nS, as shown in FIG. 6(A), in response to a frequency f. On the other hand, since each of the MOS transistors contained in the digital signal processing circuit 12" of the region 102' has a large parasitic capacitance, an operation therein is carried out comparatively slow with a long rising time and a long trailing time of about 5 nS, as shown in FIG. 6(B), in response to the same frequency f. In this case, the digital signal processing circuit 12" becomes operable with a frequency f/n. Accordingly, the operation in the digital signal processing circuit 12" is not subjected to a harmful effect, even though the rising time and the trailing time become long, as mentioned above. As the digital signal processing circuit 12" occupies a major part of the semiconductor integrated circuit, the rising time and the trailing time of the MOS transistors contained in the major part become long. Since a quantity of electromagnetic emission caused by operations of MOS transistors is in inverse proportion to a length of the rising time and the trailing time, it becomes possible that a quantity of electromagnetic emission produced in the digital signal processing circuit 12" is reduced.

In this embodiment, the rising time and the trailing time in the digital signal processing circuit 12" is 5 nS while those in the serial-parallel conversion circuit 11", the parallel-serial conversion circuit 13", and the clock signal dividing circuit 14" is 1 nS. The quantities of electromagnetic emissions thereby reduced are introduced by the following equations.

At first, trapezoidal waves are defined by the following equation;

$$In = \frac{2I \sin(n\pi d)}{n\pi} \cdot \frac{\sin(n\pi tr/T)}{n\pi tr/T},$$

wherein I represents a crest value of peak to peak, d represents a duty cycle, tr represents a rising time and a trailing time, T represents a period, n represents a degree of higher wave.

Accordingly, in the case of FIG. 6(A), $I_{11}$ is defined by the following equation;

$$I_{11} = \frac{2I\sin(11\pi \cdot 0.5)}{11\pi} \cdot \frac{\sin(11\pi(1/100))}{11\pi(1/100)}$$

$$= \frac{2I}{11\pi} \cdot \frac{0.338}{11\pi(1/100)},$$

wherein d=0.5 (50%), tr=1 nS, f=10 MHz, T=100 nS.

On the other hand, in the case of FIG. 6(B), $I_{11}$ is defined by the following equation;

$$I_{11} = \frac{2I\sin(11\pi \cdot 0.5)}{11\pi} \cdot \frac{\sin(11\pi(5/100))}{11\pi(5/100)}$$

$$= \frac{2I}{11\pi} \cdot \frac{0.1975}{11\pi(1/100)},$$

wherein d=0.5 (50%), tr=5 nS, f=10 MHz, T=100 nS.

From the above equations, it will be understood that the electromagnetic emissions of (2) is reduced 58% (4.7 dB) in quantity in comparison with those of (1).

Figure 7:
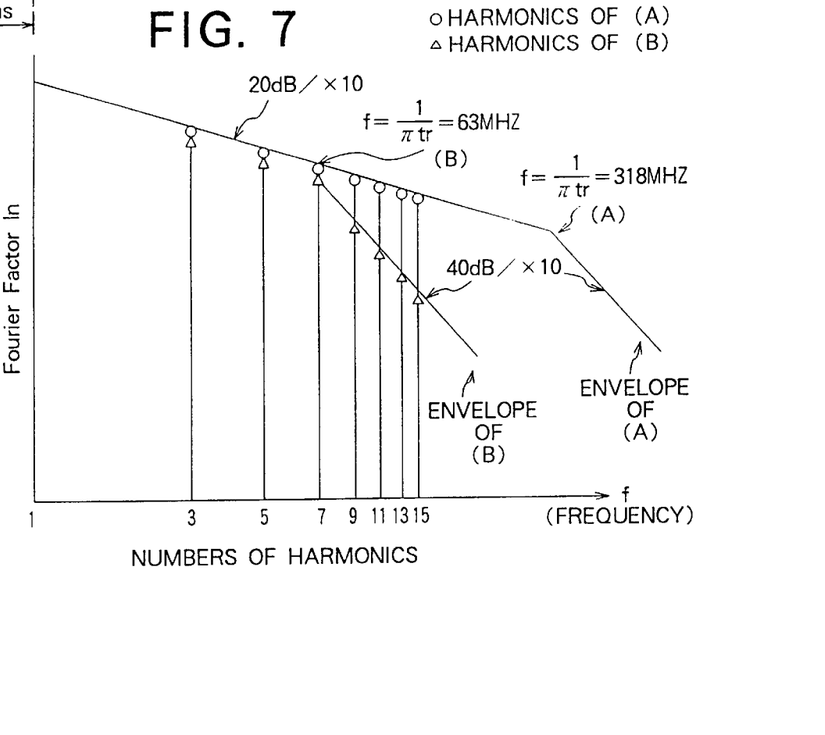
FIG. 7 is a graph for envelopes of Fourier spectra in the waveforms illustrated in FIGS. 6(A) and 6(B)

In FIG. 7, illustrated is a graph for envelopes of Fourier spectra in the waveforms shown in FIGS. 6(A) and 6(B).

As shown in FIG. 7, the higher wave and the higher frequency it becomes, the less quantities of electromagnetic emissions become. In addition, the shorter the rising time and the trailing time become, the less quantities of electromagnetic emissions become.

It should be noted that quantities of electromagnetic emissions caused by operations of MOS transistors in the serial-parallel conversion circuit 11", the parallel-serial conversion circuit 13", and the clock signal dividing circuit 14" are not reduced. Nevertheless, it is possible that quantities of electromagnetic emissions are drastically reduced, as a whole, in the semiconductor integrated circuit. The reason is that the serial-parallel conversion circuit 11", the parallel-serial conversion circuit 13", and the clock signal dividing circuit 14" merely occupy a minor part of the semiconductor integrated circuit.

Figure 8:
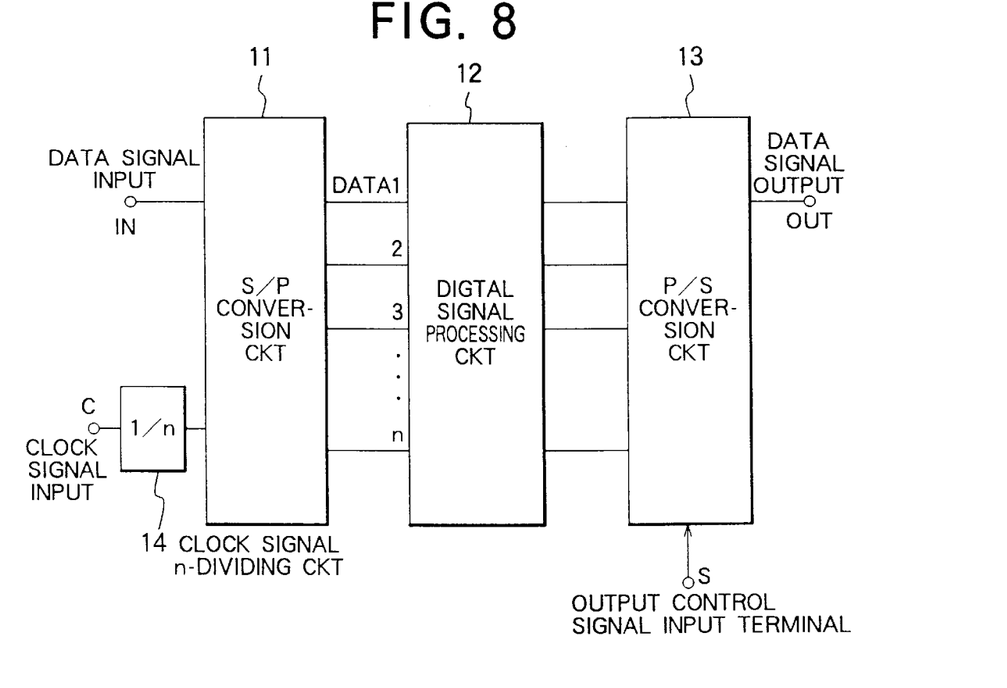
FIG. 8 is a block diagram of a semiconductor integrated circuit according to a fourth embodiment of the present invention.

Referring to FIG. 8, description will proceed to a semiconductor integrated circuit according to a fourth embodiment of the present invention.

FIG. 8 is a block diagram of a semiconductor integrated circuit according to the fourth embodiment of the present invention.

The semiconductor integrated circuit according to the fourth embodiment has a structure similar to that of the previous embodiments applied to the signal processing circuit illustrated in FIG. 1. Similar portions are designated by like reference numerals.

In FIG. 8, a production of an output signal produced from the parallel-serial conversion circuit 13 is controlled by an output control signal supplied through an output control signal input terminal S. The output control signal input terminal S comprises MOS transistors each of which has a low cut-off frequency and a large parasitic capacitance. Accordingly, the MOS transistors are not seriously responsive to noises. As a result, it is possible to effectively reduce erroneous operations caused by the noises.

Figure 9:
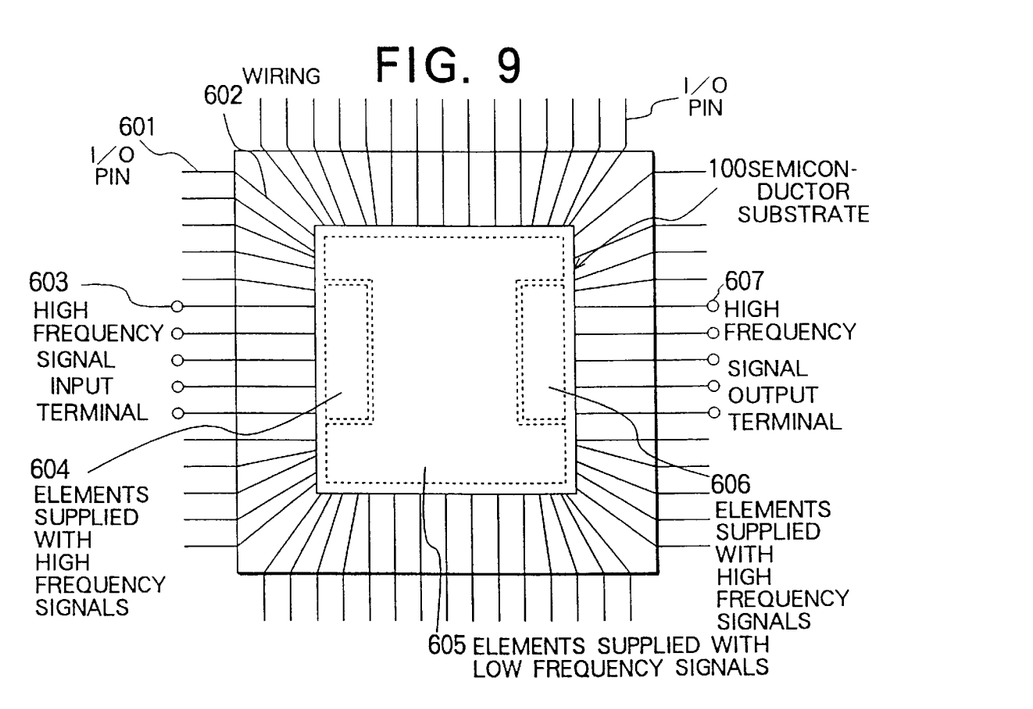
FIG. 9 is a view for illustrating an example of a physical location of the semiconductor integrated circuit of the present invention in which high frequency element and low frequency element are intermingled.

FIG. 9 is a view for illustrating an example of a physical location of the semiconductor integrated circuit of the present invention in which high frequency element and low frequency element are intermingled.

The semiconductor integrated circuit illustrated in FIG. 9 comprises a semiconductor substrate 100 having a central portion and an outer portion, high frequency signal input terminals 603, elements 604 supplied with high frequency signals, elements 605 supplied with low frequency signals, elements 606 supplied with high frequency signals, and high frequency signal output terminals 607. Besides, the semiconductor integrated circuit further comprises I/O pins 601 and wirings 602. In FIG. 9, the elements 604 supplied with high frequency signals are located in the outer portion of the semiconductor substrate 100 while the elements 605 supplied with low frequency signals are located in the central portion thereof. The elements 604 supplied with high frequency signals are thereby close to the high frequency signal input terminals 603. Consequently, an electric current loop produced by the high frequency signals becomes considerably small. Accordingly, it is possible to reduce an electromagnetic emission due to such high frequency signals which is the most serious problem in the aforesaid electromagnetic emissions.

While this invention has thus far been described in conjunction with only several embodiments thereof, it will readily be possible for those skilled in the art to put this invention into practice in various other manners.

For example, in the above-mentioned embodiments, description is made about examples in which the present invention is applied to a digital signal processing circuit of serial-parallel conversion system. However, the present invention can also be applied to an integrated circuit in which a circuit having a fast operation speed and a circuit having a slow operation speed are intermingled.

Moreover, in the above-mentioned embodiments, description is made about semiconductor integrated circuits in which MOS transistors are employed as circuit elements. However, the present invention can also be applied to an integrated circuit similar to the aforesaid second embodiment, in which bi-polar transistors are employed as circuit elements.

What is claimed is:

1. A semiconductor integrated circuit comprising:
   a fast operation circuit which is operable at a primary operation speed and which is composed of a semiconductor element operable with a first rising time and a first trailing time;
   a slow operation circuit which is operable at a secondary operation speed smaller than said primary operation speed and which is composed of a semiconductor element operable with a second rising time and a second trailing time; and
   said second rising time and said second trailing time being longer than said first rising time and said first trailing time.

2. A semiconductor integrated circuit as claimed in claim 1, said fast operation circuit being composed of a first MOS transistor having a first channel length, said slow operation circuit being composed of a second MOS transistor having a second channel length, wherein said second channel length is larger than said first channel length.

3. A semiconductor integrated circuit as claimed in claim 1, said fast operation circuit being supplied with a first bias voltage, said slow operation circuit being supplied with a second bias voltage, wherein said second bias voltage is lower than said first bias voltage.

4. A semiconductor integrated circuit as claimed in claim 1, said fast operation circuit being composed of a first semiconductor element having a first parasitic capacitance, said slow operation circuit being composed of a second semiconductor element having a second parasitic capacitance, wherein said second parasitic capacitance is larger than said first parasitic capacitance.

5. A semiconductor integrated circuit for use in a signal processing which includes serial-parallel conversion, comprising:
   a serial signal processing circuit which is operable at a primary operation speed and which is composed of a semiconductor element operable with a first rising time and a first trailing time;

a parallel signal processing circuit which is operable at a secondary operation speed smaller than said primary operation speed and which is composed of a semiconductor element operable with a second rising time and a second trailing time; and said second rising time and said second trailing time being longer than said first rising time and said first trailing time.

6. A semiconductor integrated circuit as claimed in claim 5, said serial signal processing circuit being composed of a first MOS transistor having a first channel length, said parallel signal processing circuit being composed of a second MOS transistor having a second channel length, wherein said second channel length is larger than said first channel length.

7. A semiconductor integrated circuit as claimed in claim 5, said serial signal processing circuit being supplied with a first bias voltage, said parallel signal processing circuit being supplied with a second bias voltage, wherein said second bias voltage is lower than said first bias voltage.

8. A semiconductor integrated circuit as claimed in claim 5, said serial signal processing circuit being composed of a first semiconductor element having a first parasitic capacitance, said parallel signal processing circuit being composed of a second semiconductor element having a second parasitic capacitance, wherein said second parasitic capacitance is larger than said first parasitic capacitance.

9. A semiconductor integrated circuit comprising:

a semiconductor substrate having a central portion and an outer portion;

a fast operation circuit which is composed of a first semiconductor element having a first parasitic capacitance;

a slow operation circuit which is composed of a second semiconductor element having a second parasitic capacitance;

said second semiconductor element being positioned at said central portion; and said first semiconductor element being positioned at said outer portion.

* * * * *